（12） United States Patent
Hanssen et al.

(10) Patent No.: US 10,284,196 B2
(45) Date of Patent: *May 7, 2019

(54) MULTI-STATE CAPACITIVE BUTTON (71) Applicant: ATMEL CORPORATION, Chandler, AZ (US)

(72) Inventors: Ingar Hanssen, Trondheim (NO); Arild Rødland, Trondheim (NO); Rian Whelan, Drogheda (IE)

(73) Assignee: Atmel Corporation, Chandler, AZ (US)

( * ) Notice: Subject to any disclaimer, the term of this patent is extended or adjusted under 35 U.S.C. 154(b) by 149 days.

This patent is subject to a terminal disclaimer.

(21) Appl. No.: 15/414,766

(22) Filed: Jan. 25, 2017

(65) Prior Publication Data

US 2017/0201254 A1 Jul. 13, 2017

Related U.S. Application Data

(63) Continuation of application No. 13/904,706, filed on May 29, 2013, now Pat. No. 9,568,524.

(51) Int. Cl.
H03K 17/96 (2006.01)
G01R 27/26 (2006.01)
H03K 17/955 (2006.01)

(52) U.S. Cl.
CPC ....... *H03K 17/962* (2013.01); *G01R 27/2605* (2013.01); *H03K 17/955* (2013.01);
(Continued)

(58) Field of Classification Search
CPC ..... H03K 17/955; H03K 2217/960775; G01R 27/2605
(Continued)

(56) References Cited

U.S. PATENT DOCUMENTS 6,958,614 B2 10/2005 Morimoto
7,663,607 B2 2/2010 Hotelling
(Continued)

FOREIGN PATENT DOCUMENTS

WO WO 2012/129247 9/2012

OTHER PUBLICATIONS

U.S. Appl. No. 61/454,936, filed Mar. 21, 2011, Myers.
(Continued)

*Primary Examiner* — Jeff W Natalini
(74) *Attorney, Agent, or Firm* — Baker Botts L.L.P.

(57) ABSTRACT

In certain embodiments, a method includes applying voltage to a sensor that includes first and second electrode tracks, the sensor proximate to a conductor depressible relative to the sensor and located between a button and the sensor. The conductor can capacitively couple with a capacitive node formed by the tracks, and the button can capacitively couple with an object. A value of a capacitance at the node is measured, the capacitance reflecting an amount of capacitive coupling between the conductor and the node. In response to the value meeting a first condition, a first button state is detected, indicating the object is within a detectable distance of and not in contact with the button. In response to the value meeting a second condition, a second button state is detected, indicating the object is in contact with the button and the conductor is not in contact with the sensor.

20 Claims, 6 Drawing Sheets (52) U.S. Cl.
CPC ............... *H03K 17/9622* (2013.01); *H03K 2217/96015* (2013.01); *H03K 2217/96054* (2013.01); *H03K 2217/96077* (2013.01); *H03K 2217/960775* (2013.01)

(58) Field of Classification Search
USPC .................................. 324/658–690; 200/600
See application file for complete search history.

(56) References Cited

U.S. PATENT DOCUMENTS

| | | | |
|---|---|---|---|
| 7,875,814 B2 | 1/2011 | Chen | |
| 7,880,729 B2 * | 2/2011 | Lynch | G06F 3/0202 345/156 |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |
| 8,049,732 B2 | 11/2011 | Hotelling | |
| 8,179,381 B2 | 5/2012 | Frey | |
| 8,749,493 B2 * | 6/2014 | Zadesky | G06F 3/0338 345/173 |
| 9,057,653 B2 * | 6/2015 | Schediwy | G01L 1/146 |
| 9,568,524 B2 * | 2/2017 | Hanssen | H03K 17/9622 |
| 2009/0315854 A1 | 12/2009 | Matsuo | |
| 2010/0026656 A1 | 2/2010 | Hotelling et al. | |
| 2011/0005845 A1 | 1/2011 | Hotelling et al. | |
| 2012/0199459 A1 | 8/2012 | Reise | |
| 2012/0217982 A1 | 8/2012 | Narayanasamy et al. | |
| 2012/0242588 A1 | 9/2012 | Myers | |
| 2012/0242592 A1 | 9/2012 | Rothkopf | |
| 2012/0243151 A1 | 9/2012 | Lynch | |
| 2012/0243719 A1 | 9/2012 | Franklin | |
| 2013/0076612 A1 | 3/2013 | Myers | |
| 2013/0126325 A1 | 5/2013 | Curtis et al. | |
| 2014/0104222 A1 | 4/2014 | Chang | |
| 2014/0267032 A1 | 9/2014 | Chandel et al. | |
| 2014/0354305 A1 | 12/2014 | Hanssen | |

OTHER PUBLICATIONS

U.S. Appl. No. 61/454,950, filed Mar. 21, 2011, Lynch.
U.S. Appl. No. 61/454,894, filed Mar. 21, 2011, Rothkopf.
I. Hanssen, U.S. Appl. No. 13/904,706, Non-final Office Action, dated Sep. 22, 2015.
I. Hanssen, U.S. Appl. No. 13/904,706, Response to Non-final Office Action, dated Dec. 28, 2015.
I. Hanssen, U.S. Appl. No. 13/904,706, Final Office Action, dated Mar. 4, 2016.
I. Hanssen, U.S. Appl. No. 13/904,706, Applicant Initiated Interview Summary, dated Jun. 22, 2016.
I. Hanssen, U.S. Appl. No. 13/904,706, RCE with Response, dated Jul. 5, 2016.
I. Hanssen, U.S. Appl. No. 13/904,706, Notice of Allowance, dated Sep. 13, 2016.

* cited by examiner

MULTI-STATE CAPACITIVE BUTTON

RELATED APPLICATION

This application is a continuation under 35 U.S.C. § 120 of U.S. application Ser. No. 13/904,706 filed May 29, 2013, entitled Multi-State Capacitive Button, incorporated herein by reference.

TECHNICAL FIELD

This disclosure relates generally to touch sensor technology, and more particularly to a multi-state capacitive button.

BACKGROUND

Electronic buttons are used in a wide variety of devices. For example, keyboards include a set of buttons that may trigger responses in an associated device upon registering a button press. Mechanical keyboards may utilize a matrix of horizontal and vertical wires that have binary switches at one or more intersections, and button presses may be registered using sensing methods that detect when one of these switches is closed in response to the pressing of a button. Certain keyboards may also include diodes between one or more of these intersection to facilitate the sensing of simultaneous key presses.

BRIEF DESCRIPTION OF THE DRAWINGS

For a more complete understanding of the present disclosure and its features and advantages, reference is now made to the following description, taken in conjunction with the accompanying drawings, in which.

DESCRIPTION OF EXAMPLE EMBODIMENTS

In particular embodiments of a multi-state capacitive button, a sensor underlying a button may be configured to identify multiple states associated with the button. For example, a controller of a keyboard may detect the extent to which a button is depressed, whether an object is in contact with the button, the position of an object relative to the button, or any combination thereof. Certain embodiments include an array of buttons (e.g., the keys of a keyboard). In such embodiments, the sensor may include a matrix of electrode tracks, each intersection of which may be associated with a particular button. A conductor between the button and the sensor may experience capacitive coupling with the underlying sensor when voltage is applied to a portion of the sensor. The conductor may in turn capacitively couple with an electrically isolating material forming the button. This configuration may effectively allow the electrical field generated by the capacitive sensor to be conveyed to the surface of the button such that the presence of a user's finger (or another object) may change a capacitance measurement of the underlying sensor. Since this capacitive effect may vary depending on the proximity of the object to the button and on the distance between the conductor and the sensor, such embodiments may enable the determination of the object's position relative to the button and the extent to which the button is depressed. Furthermore, pressing the button may cause the conductor to come into contact with the sensor, which may create a galvanic connection between two electrode tracks of the sensor. Detection of this galvanic connection by the controller may trigger a switch to an alternative sensing method, such as a traditional mechanical keyboard sensing technique.

A multi-state capacitive button may provide one or more technical advantages. Various embodiments of the present disclosure may include all, some, or none of these benefits. One technical advantage may be the ability to measure button presses using both capacitive measurements and traditional measurements used by mechanical keyboards. Certain embodiments may enable the addition of capacitive sensing to existing keyboard components without disabling existing mechanical switch sensing capabilities. For example, touch-sensing functionality and proximity-sensing functionality may be added to mechanical matrix keyboards. Another technical advantage may be the ability to distinguish between button touches and presses. Yet another technical advantage may be the ability to provide a multi-state button using certain components of existing keyboards, thereby reducing the cost of providing improved button sensing. A multi-state capacitive button may allow mechanical and/or tactile feedback by providing touch-sensitive regions associated with movable buttons. As another example of a technical advantage, certain embodiments may improve the ability to perform touch sensing and proximity sensing in keyboards utilizing a housing of grounded metal surrounding the buttons.

Furthermore, certain embodiments may allow multiple simultaneous key presses to be detected without requiring the use of diodes. Removing the need for certain hardware components, such as certain diodes, may also provide cost savings and simplify production. As another example, the capacitive functionality of a multi-state capacitive button may allow the detection of various states of button depression and object proximity, and detection of these states may allow the triggering of various beneficial keyboard functions. For example, user proximity-detection may allow an associated device to "wake up" from a hibernating state, allowing devices to save power and other resources when the user is away and allowing for quicker reactivation when the user returns. Such proximity-detection may also enable the triggering of various other functions, such as turning on a keyboard light, triggering various device features, or activating additional components. In some embodiments, combining electrical key presses with self-capacitance proximity sensing may allow the controller to distinguish between a hand (or fingers) and other types of objects pressing the keyboard, which may improve the ability to identify accidental button presses. Furthermore, certain embodiments may provide improved electrical isolation, which may provide improved safety and/or improve water resistance.

Figure 1:
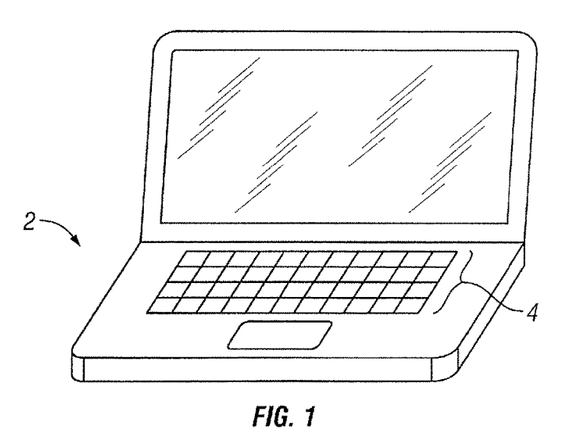
FIG. 1 illustrates an example of a device that may utilize multi-state capacitive buttons, according to certain embodiments of the present disclosure.

FIG. 1 illustrates an example of device 2 that may utilize multi-state capacitive buttons. Device 2 includes keyboard 4. In the depicted embodiment, device 2 is a laptop computer, though numerous other devices may utilize multi-state capacitive buttons. For example, device 2 may be a laptop computer, a stand-alone keyboard, a smart phone, a tablet computer, an appliance, or any other suitable device utilizing one or more buttons. In addition to keyboard 4, device 2 may include additional components that operate to measure and interpret signals associated with keyboard 4 to perform various functions. For example, device 2 may process input provided by one or more multi-state capacitive buttons of keyboard 4 to facilitate typing, trigger a sleep mode and/or reactivation, trigger the activation and deactivation of a light associated with keyboard 4, provide responsiveness to the physical movement of the buttons, distinguish between purposeful and accidental button presses, or provide any other suitable functionality.

In some embodiments, keyboard 4 is a collection of one or more capacitive buttons and associated components. For example, keyboard 4 may be an integrated keyboard, a standalone keyboard, a numerical keypad, a set of one or more buttons on a smart phone or tablet computer, or a set of one or more buttons on any suitable electronic device. Keyboard 4 includes one or more multi-state capacitive buttons, which provide input to additional components of device 2 by affecting capacitive measurements of an associated capacitive sensor (e.g., touch sensor 10 of FIGS. 2 and 3). Examples of components and operation of keyboard 4 are described further below with respect to FIG. 3.

Figure 2:
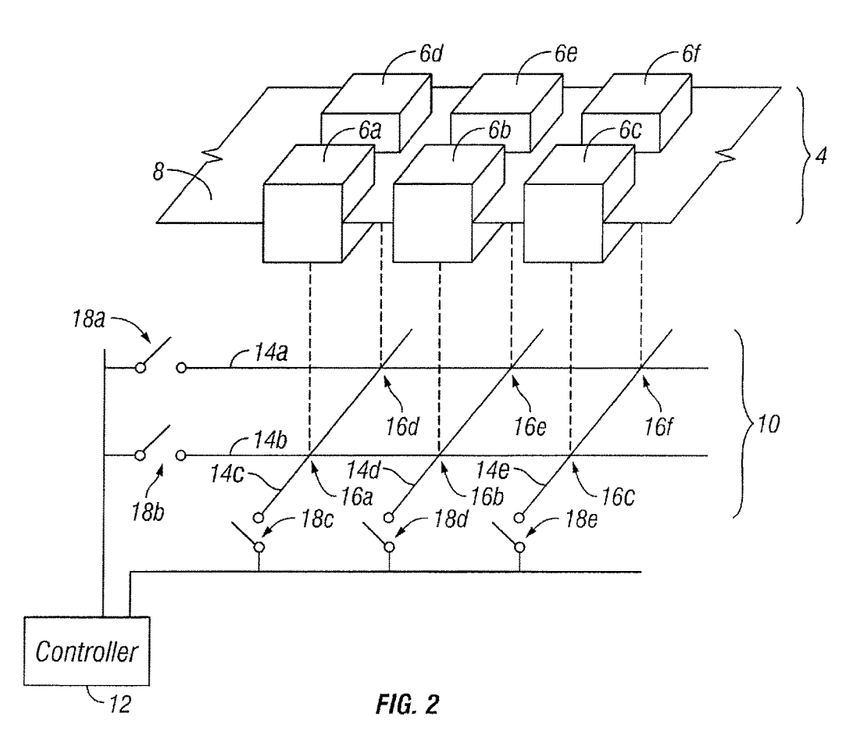
FIG. 2 illustrates a portion of an example of a keyboard, touch sensor, and touch-sensor controller that may be used in the device of FIG. 1, according to certain embodiments of the present disclosure.

FIG. 2 illustrates portions of examples of keyboard 4, touch sensor 10, and touch-sensor controller 12 that may be used in device 2 of FIG. 1. Keyboard 4 is situated proximate to touch sensor 10, which is connected to touch-sensor controller 12. For purposes of illustration, a portion of keyboard 4 is shown separated from the corresponding portion of touch sensor 10 to illustrate the correlation of the components of keyboard 4 with the corresponding components of touch-sensor 10. Keyboard 4 includes buttons 6a-6f, which are housed in cover 8. Touch sensor 10 includes tracks 14a-14e, the intersections of which form capacitive nodes 16a-16f. Buttons 6a, 6b, 6c, 6d, 6e, and 6f correspond to capacitive nodes 16a, 16b, 16c, 16d, 16e, and 16f, respectively. Tracks 14a, 14b, 14c, 14d, and 14e are connected to touch-sensor controller 12 by switches 18a, 18b, 18c, 18d, and 18e, respectively.

Keyboard 4 may include any of the components and perform any of the functions described above with respect to FIG. 1. Keyboard 4 may include any suitable number, orientation, and configuration of buttons 6 and cover 4.

Buttons 6a-6f may be any suitable capacitive button that can be pressed to facilitate operation of a device. Each button 6 is situated proximate to and may change the capacitance of a capacitive node 16 (capacitive nodes 16 are described in further detail below). For example button 6a, is positioned above capacitive node 16a and may change the capacitance of capacitive node 16a based on the position of an object, such as finger, relative to button 6a and the distance between button 6a and capacitive node 16a (e.g., whether the button is in a pressed or unpressed state). This capacitive change may be measured to determine whether an object is near, touching, and/or pressing button 6a. Such measurements may enable responsiveness based on the extent to which buttons 6 are depressed. Such measurements may also trigger various other responses in device 2 and/or keyboard 4. Furthermore, these capacitive measurements may allow device 2 to distinguish between purposeful and accidental touches. For example, pressing a button with a finger may create a different capacitive change than pressing the button by another type of object, which may allow keyboard 4 to register button presses by fingers and not by other types of objects. The configuration and operation of buttons 6 are described further below with respect to FIGS. 4 and 5A-D.

Cover 8 may include any suitable material configured to house one or more buttons 6. Cover 8 may comprise metal, plastic, silicone, or any other suitable material. Cover 8 may have one or more openings through which one or more buttons 6 may pass. In some embodiments, such openings may form a substantially water-tight seal around buttons 6. In some embodiments, cover 8 may substantially prevent or may interfere with the propagation of electrical fields through the material of cover 8. In such embodiments, electrical fields may be directly or indirectly conveyed through cover 8 by buttons 6, which may improve the ability to perform proximity sensing in embodiments utilizing a grounded, conductive housing. Cover 8 may also provide improved physical and electrical isolation, which may provide improved safety and/or improved water resistance.

Touch sensor 10 may include any suitable circuitry and other components operable to perform capacitive sensing. Touch sensor 10 may include a printed circuit board (PCB) or any other suitable component. Touch sensor 10 may be situated underneath or otherwise connected to keyboard 4 to detect the presence and location of a touch or the proximity of an object relative to keyboard 4. Herein, reference to a touch sensor may encompass both the touch sensor and its touch-sensor controller, in particular embodiments. Similarly, reference to a touch-sensor controller may encompass both the touch-sensor controller and its touch sensor, in particular embodiments. Touch sensor 10 may include one or more touch-sensitive areas. In certain embodiments, touch sensor 10 includes an array of drive and sense electrodes (or an array of electrodes of a single type) disposed on one or more substrates, which may be made of a dielectric material. Herein, reference to a touch sensor may encompass both the electrodes of the touch sensor and the substrate(s) on which the electrodes are disposed, in particular embodiments. Alternatively, in particular embodiments, reference to a touch sensor may encompass the electrodes of the touch sensor, but not the substrate(s) on which the electrodes are disposed.

In some embodiments, touch sensor 10 includes tracks 14a-14e, which may form one or more capacitive nodes 16. Touch sensor 10 may perform mutual capacitance measurements, self-capacitance measurements, or any other suitable type of capacitive measurement. In some embodiments, touch sensor 10 may perform other types of measurements, such as, for example, resistive measurements, force measurements, or any other suitable measurement. Touch sensor 10 may also use certain sensing methods to detect the closing of a mechanical switch when a button 6 is depressed. Sensing methods other than capacitive sensing may be performed concurrently with capacitive sensing. Additionally or alternatively, sensing methods may be switched upon the detection of particular state of a button 6. Measurements of touch sensor 10 may indicate whether one or more buttons 6 are being pressed and/or whether an object, such as a user's finger, is near or touching one or more buttons 6. These measurements may also allow keyboard 4 to respond based on the extent to which a button 6 is depressed. For example, certain embodiments may provide tactile feedback (e.g., vibration, clicking, or any suitable feedback that allows the user to physically sense that the button 6 has been sufficiently pressed) when the capacitance measurement indicates that the button 6 is depressed. Measurements of touch sensor 10 may also enable the detection of various states of buttons 6, which may enable the triggering of various responses in device 2.

Touch sensor 10 may implement a capacitive form of touch sensing. In a mutual-capacitance implementation, touch sensor 10 may include an array of drive and sense electrodes forming an array of capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by touch-sensor controller 12) may induce a charge on the sense electrode, and the amount of charge induced may be susceptible to external influence (such as a touch or the proximity of an object). When an object touches or comes within proximity of the capacitive node, a change in capacitance may occur at the capacitive node and touch-sensor controller 12 may measure the change in capacitance. For example, depressing button 6a may cause a change in capacitance at capacitive node 16a. By measuring changes in capacitance throughout the array, touch-sensor controller 12 may determine the position of the touch or proximity within the touch-sensitive area(s) of touch sensor 10. For example, touch-sensor controller 12 may determine which button or buttons 6 have been touched and/or depressed. Touch-sensor controller 12 may also determine if a user is within a threshold distance of keyboard 4.

In a self-capacitance implementation, touch sensor 10 may include an array of electrodes of a single type that may each form a capacitive node. When an object touches or comes within proximity of the capacitive node, a change in self-capacitance may occur at the capacitive node and touch-sensor controller 12 may measure the change in capacitance, for example, as a change in the amount of charge needed to raise the voltage at the capacitive node by a pre-determined amount. As with a mutual-capacitance implementation, by measuring changes in capacitance throughout the array, touch-sensor controller 12 may determine the position of the touch or proximity within the touch-sensitive area(s) of touch sensor 10. This disclosure contemplates any suitable form of capacitive touch sensing, in particular embodiments.

In particular embodiments, one or more drive electrodes may together form a drive line running horizontally or vertically or in any suitable orientation. Similarly, one or more sense electrodes may together form a sense line running horizontally or vertically or in any suitable orientation. In particular embodiments, drive lines may run substantially perpendicular to sense lines. Herein, reference to a drive line may encompass one or more drive electrodes making up the drive line, and vice versa, in particular embodiments. Similarly, reference to a sense line may encompass one or more sense electrodes making up the sense line, and vice versa, in particular embodiments.

A change in capacitance at a capacitive node of touch sensor 10 may indicate a touch or proximity input at the position of the capacitive node. For example, a change in capacitance at capacitive node 16b of FIG. 2 may indicate that a user has touched button 6b. Touch-sensor controller 12 may detect and process the change in capacitance to determine the presence and location of the touch or proximity input. Furthermore, the amount of the capacitive change may indicate that a user is near, touching, and/or depressing a particular button 6, as shown in FIGS. 5A-5D and FIG. 6. Touch-sensor controller 12 may then communicate information about the touch or proximity input to one or more other components (such one or more central processing units (CPUs)) of a device that includes touch sensor 10 and touch-sensor controller 12, which may respond to the touch or proximity input by initiating a function of the device (or an application running on the device). Although this disclosure describes a particular touch-sensor controller having particular functionality with respect to a particular device and a particular touch sensor, this disclosure contemplates any suitable touch-sensor controller having any suitable functionality with respect to any suitable device and any suitable touch sensor.

Touch-sensor controller 12 may include any circuitry and other components configured to control the operation of touch sensor 10. Touch-sensor controller 12 may control the sensing operations of touch sensor 10. For example, touch-sensor controller 12 may control the application of voltage to one or more tracks 14 and provide one or more corresponding measurements (such as, for example, capacitance measurements). Touch-sensor controller 12 may also switch between one or more operating modes. For example, touch-sensor controller 12 may cause touch sensor 10 to operate in an acquisition mode wherein touch sensor 10 uses less power while waiting for the user to approach the keyboard. Upon detecting the proximity of the user based on one or more capacitive measurements, touch-sensor controller 12 may trigger another type of operating mode in which button presses may be detected. As another example, touch-sensor controller 12 may switch between self-capacitance sensing and mutual-capacitance sensing. For example, touch-sensor controller 12 may use self-capacitance measurements when waiting for an object to come near keyboard 4 (as shown, for example, in FIG. 7D) at which point it may transition to using mutual-capacitance measurements (as shown, for example, in FIG. 7B). Self-capacitance and mutual capacitance sensing are discussed further below with respect to FIG. 3. Touch-sensor controller 12 may also trigger various responses in device 2 based on the capacitance measurements of touch sensor 10.

Touch-sensor controller 12 may be one or more integrated circuits (ICs), such as for example general-purpose microprocessors, microcontrollers, programmable logic devices or arrays, application-specific ICs (ASICs). In particular embodiments, touch-sensor controller 12 comprises analog circuitry, digital logic, and digital non-volatile memory. In particular embodiments, touch-sensor controller 12 is disposed on a flexible printed circuit (FPC) bonded to the substrate of touch sensor 10, as described below. The FPC may be active or passive, in particular embodiments. In particular embodiments, multiple touch-sensor controllers 12 are disposed on the FPC. Touch-sensor controller 12 may include a processor unit, a drive unit, a sense unit, and a storage unit. The drive unit may supply drive signals to the drive electrodes of touch sensor 10. The sense unit may sense charge at the capacitive nodes of touch sensor 10 and provide measurement signals to the processor unit representing capacitances at the capacitive nodes 16. The processor unit may control the supply of drive signals to the drive electrodes by the drive unit and process measurement signals from the sense unit to detect and process the presence and location of a touch or proximity input within the touch-sensitive area(s) of touch sensor 10. The processor unit may also track changes in the position of a touch or proximity input within the touch-sensitive area(s) of touch sensor 10. The storage unit may store programming for execution by the processor unit, including programming for controlling the drive unit to supply drive signals to the drive electrodes, programming for processing measurement signals from the sense unit, and other suitable programming, in particular embodiments. Although this disclosure describes a particular touch-sensor controller having a particular implementation with particular components, this disclosure contemplates any suitable touch-sensor controller having any suitable implementation with any suitable components.

Tracks 14a-14e may include electrode tracks and any other suitable components for performing capacitive measurements. Herein, the term track or electrode track may refer to all or part of an electrode on touch sensor 10. An electrode (whether a ground electrode, a guard electrode, a drive electrode, or a sense electrode) may be an area of conductive material forming a shape, such as for example a disc, square, rectangle, thin line, other suitable shape, or suitable combination of these. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of indium tin oxide (ITO) and the ITO of the electrode may occupy approximately 100% of the area of its shape (sometimes referred to as 100% fill), in particular embodiments. In particular embodiments, the conductive material of an electrode may occupy substantially less than 100% of the area of its shape. As an example and not by way of limitation, an electrode may be made of fine lines of metal or other conductive material (FLM), such as for example copper, silver, or a copper- or silver-based material; and the fine lines of conductive material may occupy approximately 5% of the area of its shape in a hatched, mesh, or other suitable pattern. Herein, reference to FLM may encompass such material, in particular embodiments. Although this disclosure describes or illustrates particular electrodes made of particular conductive material forming particular shapes with particular fill percentages having particular patterns, this disclosure contemplates any suitable electrodes made of any suitable conductive material forming any suitable shapes with any suitable fill percentages having any suitable patterns.

Particular tracks 14 may provide drive connections for coupling touch-sensor controller 12 to drive electrodes of touch sensor 10, through which the drive unit of touch-sensor controller 12 may supply drive signals to the drive electrodes. Other tracks 14 may provide sense connections for coupling touch-sensor controller 12 to sense electrodes of touch sensor 10, through which the sense unit of touch-sensor controller 12 may sense charge at the capacitive nodes of touch sensor 10. The drive and sense electrodes may not make electrical contact with each other—instead they may be capacitively coupled to each other across a dielectric at the intersection. This gap may be bridged when button 6 is sufficiently pressed to cause a conductor (such as conductor 20 of FIG. 4) to galvanically connect the drive and sense electrodes. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

In a particular embodiment, tracks 14a and 14b are substantially parallel to each other and substantially perpendicular to tracks 14c-14e, and a capacitive node 16 may be formed at each intersection of tracks 14. Voltage may be applied to one or more tracks 14 during a sensing sequence, and the capacitance at a capacitive node 16 may be measured. Changes in the amount of capacitance experienced by one or more tracks 14 may indicate the proximity of an object, such as a finger, as well as the extent to which a button 6 is pressed.

Capacitive nodes 16a-16f represent areas of touch sensor 10 that are operable to provide discrete capacitive measurements. In the illustrated embodiments, each capacitive node 16 is located at the intersection of two tracks 14. For example, capacitive node 16a is located at the intersection of tracks 14b and 14c. In other embodiments, capacitive nodes 16 may correspond to other portions of touch sensor 10. For example, in an embodiment where multiple tracks 14 are driven together and multiple tracks 14 are sensed together, the corresponding capacitive node 16 may encompass the area bounded by the driven and sensed tracks 14. Various examples of different configurations of capacitive nodes 16 are described below regarding FIGS. 7A-7D. Different configurations of capacitive nodes 16 may provide different levels of sensitivity and or granularity with respect to capacitive measurements. For example, in embodiments where each button 6 is associated with a different capacitive node 16 (e.g., the embodiment shown in FIG. 2), user proximity and button-depression sensing may be determined separately for each button 6. In embodiments where multiple tracks 14 a sensed together (e.g., the configurations shown in FIGS. 7A, 7C, and 7D), the sensitivity of proximity sensing may be improved, though the ability to measure each button 6 independently may be reduced. Different configurations of capacitive nodes 16 may be achieved by configuring one or more switches 18.

Switches 18a-18e may be any suitable circuitry operable to connect or disconnect a track 14 from a portion of touch-sensor controller 12. Switches 18 may be part of touch sensor 10 or touch-sensor controller 12. Switches 18 may control which tracks 14 have voltage applied during a sensing sequence. For example, switches 18*a* and 18*c* may be closed so that track 14*a* operates as a drive line and track 14*c* operates as sense line, which may provide a capacitive measurement at capacitive node 16*d* corresponding to button 6*d*. Furthermore, the states of switches 18 may be adjusted sequentially to provide successive measurements at capacitive nodes 16*a*-16*f*. Additional configurations of switches 18 are discussed below regarding FIG. 7A-7D.

Figure 3:
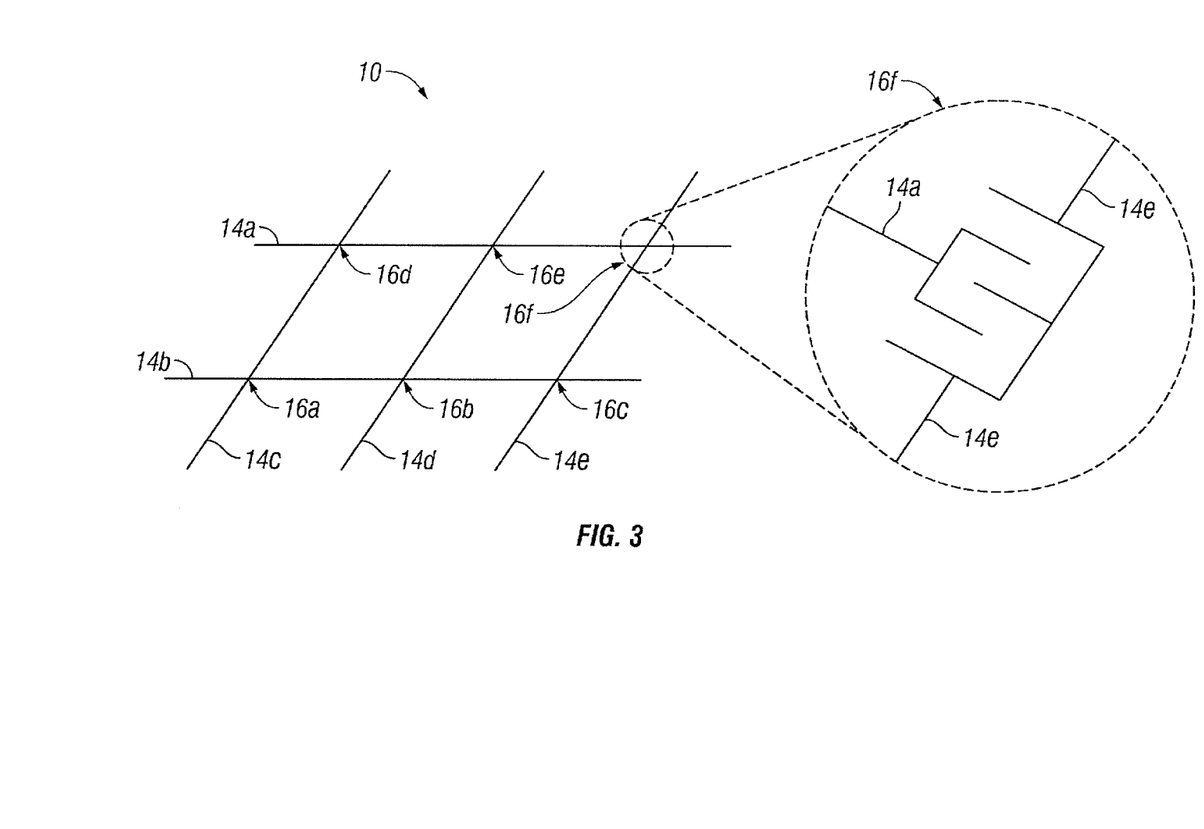
FIG. 3 illustrates an example of a touch sensor that may be used in certain embodiments of FIG. 2, according to certain embodiments of the present disclosure.

FIG. 3 illustrates an example of touch sensor 10 that may be used in certain embodiments of FIGS. 1 and 2. Touch sensor 10 includes tracks 14, the intersections of which form capacitive nodes 16. These components may include any suitable structure or configuration described above with respect to FIG. 2 and may be operable to perform any suitable function described above with respect to FIG. 2.

FIG. 3 also illustrates a magnified view of an example of capacitive node 16*f*. This view depicts an example of the intersection of tracks 14*a* and 14*e* that may allow the sensing of capacitance measurements at capacitive node 16*f*. Furthermore, the configuration of tracks 14*a* and 14*e* at their intersection may allow a galvanic connection to be formed when a conductor (e.g., conductor 20 of FIG. 4, described below) is pressed against this portion of touch sensor such that current moving through track 14*a* may pass through the conductor to track 14*e*, or vice versa. In certain embodiments, track 14*a* may cross over track 14*f* by passing over or underneath track 14*f*, such that the tracks 14 are not in electrically conductive contact in the absence of the separate conductor. Though FIG. 3 depicts a particular configuration of the intersections of tracks 14, any suitable configuration may be used. Such configurations may be used to provide capacitive sensing with existing keyboard components without disabling existing mechanical switch sensing capabilities. Some embodiments may therefore provide improved button sensing at a reduced cost by repurposing certain components of existing hardware to provide capacitive sensing in addition to traditional mechanical switch sensing.

Figure 4:
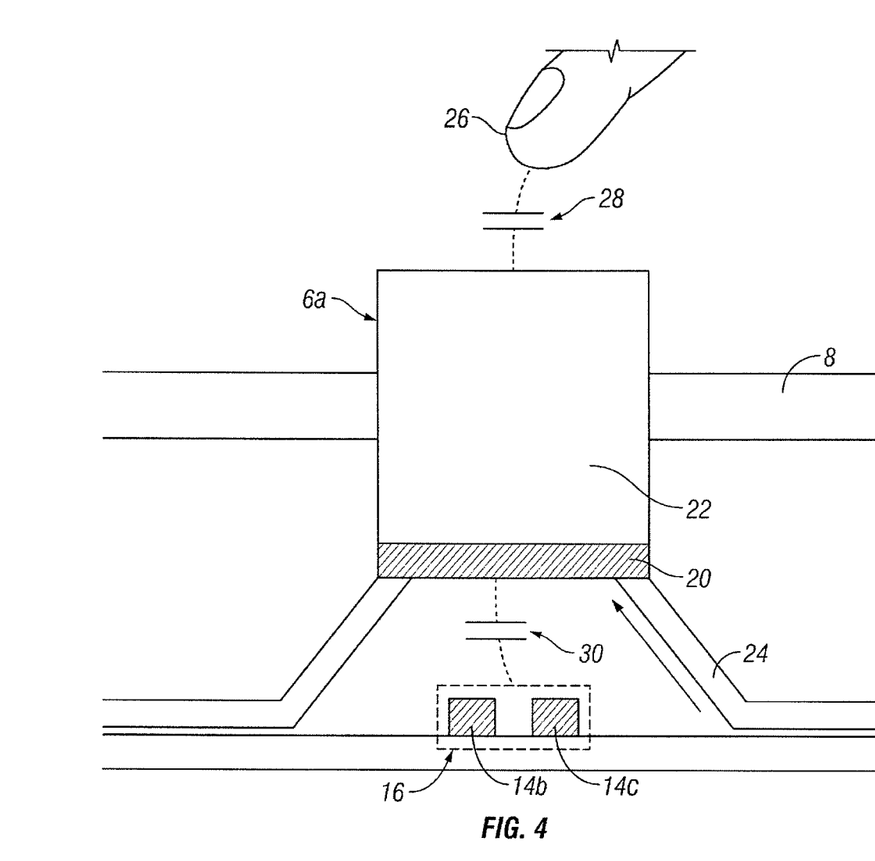
FIG. 4 illustrates examples of components that may be used in the keyboard of FIG. 2, according to certain embodiments of the present disclosure.

FIG. 4 illustrates a cross-sectional view of examples of components that may be used in keyboard 4 and touch sensor 10 of FIG. 2. The illustrated portion of keyboard 4 includes button 6*a*, cover 8, and support 24. The illustrated portion of touch sensor 10 includes tracks 14*b* and 14*c*, which form capacitive node 16*a*, and button 6*a* includes conductor 20 and isolator 22. Finger 26 and button 6*a* experience capacitive coupling 28, and button 6*a* and capacitive node 16*a* experience capacitive coupling 30.

Conductor 20 may be any suitable material capable of creating a galvanic connection between the underlying tracks 14 when brought into contact with these tracks 14 when a button 6 is depressed. Conductor 20 may be a uniform material, a composite material, a combination of materials, any other suitable material, or any suitable combination thereof. For example, conductor 20 may include metal, carbon, any other suitably conductive material, or any combination thereof. Conductor 20 may have any suitable configuration that enables the creation of a galvanic connection between tracks 14*b* and 14*c* when button 6*a* is sufficiently depressed. In some embodiments, conductor 20 may be integrally formed as part of button 6*a*, while in other embodiments, conductor 20 may be separate from button 6*a*. For example, in some embodiments, conductor 20 may be formed as part of support 24. In some embodiments, conductor 20 may come into contact with touch sensor 10 when button 6*a* is fully depressed, while in other embodiments, conductor 20 may come into contact with touch sensor 10 when button 6*a* is partially depressed. Furthermore, conductor 20 may be configured to enable capacitive coupling 30 between conductor 20 and capacitive node 16*a*. Conductor 20 may therefore enable capacitive measurements by touch-sensor controller 12 while also enabling traditional mechanical keyboard sensing upon contacting touch sensor 10 when button 6*a* is depressed.

Isolator 22 may be any suitable material having a low dielectric constant. Isolator 22 may be a uniform material, a composite material, a combination of materials, any other suitable material, or any suitable combination thereof. For example, isolator 22 may be include one or more electrically isolating materials such as certain types of rubber, plastic, or any other suitable material. The dielectric constant of isolator 22 may be sufficiently high to enable capacitive coupling between isolator 22 and conductor 20 and to enable capacitive coupling between isolator 22 and FIG. 26. In certain embodiments, isolator 22 may have a dielectric constant greater than 2.5, greater than 3, greater than 4, greater than 5, or any suitably high dielectric constant. Although these particular dielectric constants are provided, the present disclosure contemplates isolator 22 having any suitable dielectric constant according to particular needs. The isolating properties of isolator 22 may electrically isolate conductor 20 from finger 26 so that when button 6*a* is depressed, current flows between tracks 14*b* and 14*c*. Furthermore, the dielectric properties of isolator 22 may enable finger 26 to influence the capacitance measured at capacitive node 16*a*, which may be advantageous in embodiments where cover 8 interferes with or otherwise prevents the propagation of electrical fields generated by touch sensor 10.

Support 24 may be any suitable structure that supports button 6*a* and deflects or otherwise moves or deforms to allow button 6*a* to move toward capacitive node 16*a* when button 6*a* is pressed. For example, support 24 may be a flexible material (e.g., silicone, rubber, or any suitable material) that flexes when force is applied to the top surface of button 6*a*, allowing button 6*a* to move toward capacitive node 16, and unflexes when the force is removed, allowing button 6*a* to move away from capacitive node 16 to its original position. Support 24 may also include a hinge, spring, compressible material, any other suitable structure for facilitating button support and movement, or any combination thereof. Support 24 may be formed as part of keyboard 4 or touch sensor 10, or support 24 may be formed as a separate structure. In some embodiments, support 24 may include a separate gasket or seal. In some embodiments, support 24 may include conductor 20.

Capacitive coupling 28 represents capacitive coupling that may occur between an object and conductor 20, and capacitive coupling 30 represents capacitive coupling that may occur between button 6*a* and capacitive node 16*a*. In the illustrated embodiment, the object coupling with button 6*a* is a user's finger 26, though other objects may be used. As finger 26 approaches button 6*a*, the amount of capacitive coupling 28 may increase, which may affect the amount of capacitive coupling 30. For example, the position and/or orientation of charges in isolator 22 may change as a result of the interaction between finger 26 and the electrical field associated with one or more portions of capacitive node 16*a*. This capacitive change may cause a change in the capacitive coupling between isolator 22 and conductor 20, which may in turn affect the amount of capacitive coupling 30. The amount of capacitive coupling 30 may also vary depending on the distance between conductor 20 and capacitive node 16*a*, and that distance is dependent on the extent to which button 6*a* is depressed. Thus, the amount of capacitive coupling 30 may change as button 6a is pressed closer to touch sensor 10. Since the amount of capacitive coupling 30 affects the capacitance detected at capacitive node 16a, measuring the capacitance at capacitive node 16a enables the determination of the position of finger 26 relative to button 6a and the position of conductor 20 (and therefore button 6a), relative to touch sensor 10.

In operation, touch sensor 10 provides a capacitive measurement indicating both the position of finger 26 relative to button 6a and the distance between button 6a and capacitive node 16a. For example, voltage may be applied to track 14b, while track 14c is sensed by touch-sensor controller 12. The distance between finger 26 and button 6a may affect the amount of capacitive coupling 28, and the amount of capacitive coupling 28 may in turn affect the amount of capacitive coupling 30. Similarly, the distance between conductor 20 and capacitive node 16a may affect the amount of capacitive coupling 30, causing the amount of capacitive coupling 30 to vary as button 6a is pressed toward capacitive node 16a. Since the capacitance value measured at capacitive node 16a varies based on the amount of capacitive coupling 30, measuring the capacitance at capacitive node 16a may enable the determination of one or more of (1) the position of finger 26 relative to button 6a and (2) the extent to which button 6a is depressed. Furthermore, the formation of a galvanic connection between tracks 14 when conductor 20 contacts touch sensor 10 may cause a detectable change in the capacitance measured by touch-sensor controller 12. The connection may also be measured by mechanical switch sensing. Such sensing may be done concurrently with capacitive sensing, or it may be triggered by the detection of a capacitance value that indicates that tracks 14b and 14c have been brought into electrically conductive contact with conductor 20.

Such measurements may enable the detection of various states of keyboard 4. For example, a capacitance measurement may indicate that a user is not near keyboard 4, that a user is near keyboard 4 but not touching button 6a, that finger 26 is touching but not depressing button 6a, that finger 26 is touching and partially depressing button 6a, that finger 26 is touching and fully depressing button 6a, or that button 6a is depressed but is not in contact with finger 26. Various responses may be triggered by the detection of one or more of such states. For example, detecting these states may enable the activation of a keyboard backlight when the user touches keyboard 4, the activation or deactivation of a power-saving mode based on the proximity of the user, distinct responses to partial and complete button presses, track pad functionality on the surface of buttons 6, security features based on particular types of button touches (e.g., unlocking device 2 by touching but not pressing certain buttons 6), or various other functions.

FIG. 5A-5D illustrate examples of button states that may be detected by touch-sensor controller 12 of FIG. 2.

Figure 5A:
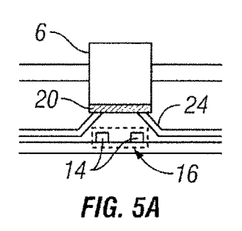
FIG. 5A illustrates an example of a state of the button of FIG. 4, according to certain embodiments of the present disclosure.

FIG. 5A illustrates an example of a button state wherein finger 26 is not within a threshold distance of button 6. Since finger 26 is not exerting force on button 6, support 24 holds button 6 away from capacitive node 16 (i.e., in an unpressed state). Furthermore, finger 26 is not present to affect the capacitance at capacitive node 16 by a threshold amount. A capacitance measurement at capacitive node 16 may indicate that button 6 is in the state shown in FIG. 5A. This measurement may enable various functionalities. For example, when this state is detected, keyboard 4 and/or device 2 may enter a power-saving mode or hibernation mode, a backlight of keyboard 4 may be turned off or remain off, the user may be logged out of device 2, or any other suitable function may be performed. Any of these functions may be triggered depending on the amount of time that button 6 has been in the state shown in FIG. 5A.

Figure 5B:
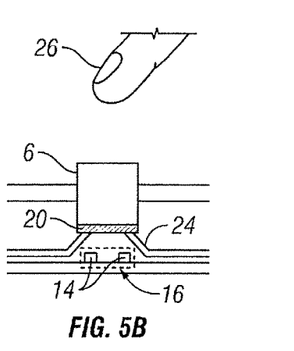
FIG. 5B illustrates an example of a state of the button of FIG. 4, according to certain embodiments of the present disclosure.

FIG. 5B illustrates an example of a button state wherein finger 26 is within a threshold distance of button 6 but is not in contact with button 6. Since finger 26 is not exerting force on button 6, support 24 holds button 6 away from capacitive node 16 (i.e., in an unpressed state). Furthermore, the proximity of finger 26 to button 6 may change the capacitance at capacitive node 16. A capacitance measurement at capacitive node 16 may indicate that button 6 is in the state shown in FIG. 5B. This measurement may enable various functionalities. For example, when this state is detected, a backlight of keyboard 4 may be turned on or off, the user may be logged into device 2, the user may be prompted to log into device 2, device 2 and/or keyboard 4 may exit a power-saving mode or hibernation mode, or any other suitable function may be performed. Any of these functions may be triggered depending on the amount of time that button 6 has been in the state shown in FIG. 5B. Furthermore, certain functions may be triggered depending on which state was previously detected.

Figure 5C:
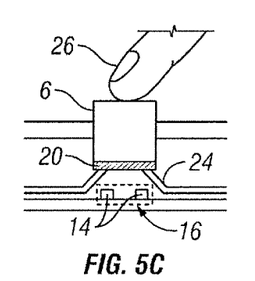
FIG. 5C illustrates an example of a state of the button of FIG. 4, according to certain embodiments of the present disclosure.

FIG. 5C illustrates an example of a button state wherein finger 26 is in contact with button 6 but has not depressed button 6. Since finger 26 is touching but not exerting sufficient force on button 6, support 24 holds button 6 away from capacitive node 16 (i.e., in an unpressed state). However, by touching the surface of button 6, finger 26 may cause a greater change in the capacitance of capacitive node 16 than it did when it was nearby but not touching button 6. A capacitance measurement at capacitive node 16 may indicate that button 6 is in the state shown in FIG. 5C. This measurement may enable various functionalities. For example, a backlight of keyboard 4 or button 6 may be turned on, the user may be logged into device 2, the user may be prompted to log into device 2, device 2 and/or keyboard 4 may exit a power-saving mode or hibernation mode, or any other suitable function may be performed. Any of these functions may be triggered depending on the amount of time that button 6 has been in the state shown in FIG. 5C, and certain functions may be triggered depending on which state was previously detected. Furthermore, detecting this state may allow device 2 to distinguish between button touches and presses, which may enable additional functionality. For example, passwords may require certain buttons 6 to be touched but not pressed. Additionally, measuring multiple buttons 6 in this manner may provide touch pad functionality on the surface of keyboard 4 as the user moves finger 26 across different buttons 6.

Figure 5D:
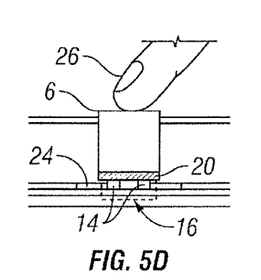
FIG. 5D illustrates an example of a state of the button of FIG. 4, according to certain embodiments of the present disclosure.

FIG. 5D illustrates an example of a button state wherein finger 26 is fully depressing button 6. Since finger 26 is exerting force on button 6, support 24 has deflected or otherwise moved to allow button 6 to move toward capacitive node 16 (i.e., button 6 is in a depressed state). The galvanic connection between tracks 14 created by conductor 20 may cause a change in the capacitance of capacitive node 16 that is detectable by touch-sensor controller 12. A capacitance measurement at capacitive node 16 and/or a traditional mechanical keyboard measurement at the intersection of tracks 14 may indicate that button 6 is in the state shown in FIG. 5D. This measurement may enable various functionalities. For example, device 2 and/or keyboard may register a button press that is distinguishable from a button touch (as shown in FIG. 5C). Because this capacitive measurement enables the detection of button presses without requiring the creation of a physical and/or galvanic connections between electrodes, mechanical wear on certain components may be reduced, which may reduce the frequency and/or cost of repairs. Furthermore, because the capacitive coupling between finger 26 and button 6 allows a button press by finger 26 and button pressed by another type of object to be distinguished, accidental touches may detected and handled appropriately. For example, the accidental pressing of a button 6 on a smartphone while in the user's pocket may be ignored.

In some embodiments, touch-sensor controller 12 may detect states that are not shown in FIGS. 5A-5D. For example, touch-sensor controller 12 may determine that button 6 is being pressed by an object that is not the user's finger 26. In such embodiments, the closer proximity of button 6 to capacitive node 16 due to the depressed state of button 6 may affect the capacitance of capacitive node 16. However, if the object pressing button 6 does not have the conductive properties of a user's finger 26 (e.g., if a non-conductive object is pressing against keyboard 4), the measured capacitance of capacitive node 16 may be different from the capacitance measured in the state shown in FIG. 5D. Since such a measurement may indicate an accidental touch, touch-sensor controller 12 may trigger an appropriate response (e.g., ignoring the button press, triggering the execution of accidental touch computer logic, or any other suitable response).

As another example of a detectable button state, touch-sensor controller 12 may detect a capacitance change that is greater than the value detected when a finger is in contact with but not depressing button 6 (i.e. the state shown in FIG. 5C) but different from the measurement detected when conductor 20 is in contact with capacitive node 16a (i.e. the state shown in FIG. 5D). Touch-sensor controller 12 may interpret such a reading as a partial button press and trigger an appropriate response. For example, if a user is inputting text, partial button presses and complete button presses may be treated as lower case letters and upper case letters, respectively. Furthermore, some embodiments may incorporate different types of measurements in addition to the capacitive measurements described above. For example, force measurements, resistive measurements, or any other suitable type of measurement may be utilized.

Figure 6:
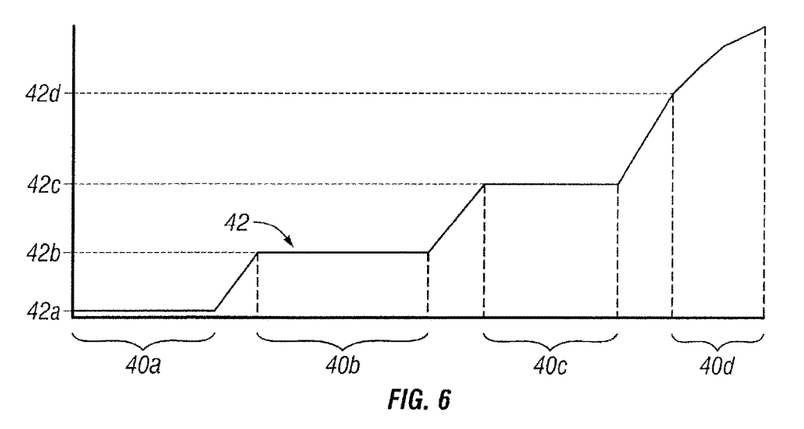
FIG. 6 illustrates a graph of examples of measurements that may be made by one or more components of FIG. 2, according to certain embodiments of the present disclosure.

FIG. 6 illustrates a graph of examples of measurements that may be taken by touch-sensor controller 12 of FIG. 2 when button 6 is in the states of FIGS. 5A-5D. FIG. 6 depicts measured values 42a-42d, which corresponding to portions 40a-40d, respectively. The change in value 42 (i.e. the transition from portion 40a to portion 40b, from portion 40b to portion 40c, and from portion 40c to portion 40d) represents the capacitive value measured at capacitive node 16 as button 6 transitions through the states shown in FIGS. 5A-5D. Values 42a-42d may be capacitance measurements, voltage measurements, current measurements, charge measurements, or any other suitable measurement indicating the capacitance at a capacitive node 16. For example, values 42a-42d may be values indicating the change in capacitance at a capacitive node 16 over time.

Portion 40a corresponds to the capacitance measurement of capacitive node 16 when button 6 is in the state shown in FIG. 5A. When finger 26 is not near button 6 and button 6 is an undepressed position, capacitive node 16 may experience little or no change in capacitance relative to its baseline state. This state of button 6 may be detected by determining when the capacitance measurement exceeds or falls below a particular threshold value, by determining when the capacitance measurement falls within a predetermined value range, or by any other suitable method. A particular value measured in portion 40a is represented by value 42a. This value may be a threshold value that provides a floor for detecting the state of button 6 shown in FIG. 5A. For example, value 42a may be approximately (or exactly) 7 picofarads ("pF"), in which case measurements of 7 pF or higher (without exceeding value 42b) may indicate that button 6 is in the state shown in FIG. 5A. Thus, the button state shown in FIG. 5A may be associated with a range of approximately 7-8 pF. Any suitable value 42a may be used, and this value may vary depending on the type of object being detected and the configurations of one or more components of keyboard 4, touch sensor 10, or touch controller 12.

Portion 40b corresponds to the capacitance measurement of capacitive node 16 when button 6 is in the state shown in FIG. 5B. When finger 26 is near but not touching button 6 and button 6 is an undepressed position, capacitive node 16 may experience a change in capacitance relative to its baseline state. This state of button 6 may be detected by determining when the capacitance measurement exceeds or falls below a particular threshold value, by determining when the capacitance measurement falls within a predetermined value range, or by any other suitable method. A particular value measured in portion 40b is represented by value 42b. This value may be a threshold value that provides a floor for detecting the state of button 6 shown in FIG. 5B. For example, value 42b may be approximately (or exactly) 8 pF, in which case measurements of 8 pF or above (without exceeding value 42c) may indicate that button 6 is in the state shown in FIG. 5B. Thus, the button state shown in FIG. 5B may be associated with a range of approximately 8-16 pF. Any suitable value 42b may be used, and this value may vary depending on the type of object being detected and the configurations of one or more components of keyboard 4, touch sensor 10, or touch controller 12.

Portion 40c corresponds to the capacitance measurement of capacitive node 16 when button 6 is in the state shown in FIG. 5C. When finger 26 is touching but not depressing button 6, capacitive node 16 may experience a change in capacitance relative to its baseline state. This change in capacitance may be greater than the change experienced when finger 26 is near but not touching button 6. This state of button 6 may be detected by determining when the capacitance measurement exceeds or falls below a particular threshold value, by determining when the capacitance measurement falls within a predetermined value range, or by any other suitable method. A particular value measured in portion 40c is represented by value 42c. This value may be a threshold value that provides a floor for detecting the state of button 6 shown in FIG. 5C. For example, value 42c may be approximately (or exactly) 16 pF, in which case measurements of 16 pF or higher (without exceeding value 42d) may indicate that button 6 is in the state shown in FIG. 5C. Thus, the button state shown in FIG. 5C may be associated with a range of approximately 16-100 pF. Any suitable value 42c may be used, and this value may vary depending on the type of object being detected and the configurations of one or more components of keyboard 4, touch sensor 10, or touch controller 12.

Portion 40d corresponds to the capacitance measurement of capacitive node 16 when button 6 is in the state shown in FIG. 5D. When finger 26 is touching and fully depressing button 6, capacitive node 16 may experience a change in capacitance relative to its baseline state. This change in capacitance may be greater than the change experienced when finger 26 touching but not depressing button 6 (i.e., when conductor 20 is not in contact with touch sensor 10). This state of button 6 may be detected by determining when the capacitance measurement exceeds a particular threshold value, by determining when the capacitance measurement falls within a predetermined value range, or by any other suitable method. A particular value measured in portion 40d is represented by value 42d. This value may be a threshold value that provides a floor for detecting the state of button 6 shown in FIG. 5D. For example, value 42d may be approximately (or exactly) 100 pF, in which case measurements of 100 pF or higher may indicate that button 6 is in the state shown in FIG. 5C. Thus, the button state shown in FIG. 5C may be associated with values at or above 100 pF. Any suitable value 42c may be used, and this value may vary depending on the type of object being detected and the configurations of one or more components of keyboard 4, touch sensor 10, or touch controller 12. In some embodiments, detecting this value may cause touch-sensor controller 12 to switch its sensing method to a traditional mechanical keyboard sensing method.

FIGS. 7A-7D depict examples of configurations of touch sensor 10 and touch-sensor controller 12 that may be used to detect whether the user is located near keyboard 4. Touch-sensor controller 12 may switch between these configurations based on various triggers. Measurement thresholds and/or ranges may be adjusted based on which configuration touch sensor 10 and touch-sensor controller 12 are currently using. Touch-sensor controller 12 may also configure whether self-capacitance, mutual capacitance, or traditional electrical keyboard measurements are taken. For example, mutual capacitance measurements may be provided in the configurations of FIGS. 7A-7C, while self-capacitance measurements may be provided in the configurations of FIG. 7D.

Figures 7A, 7B:
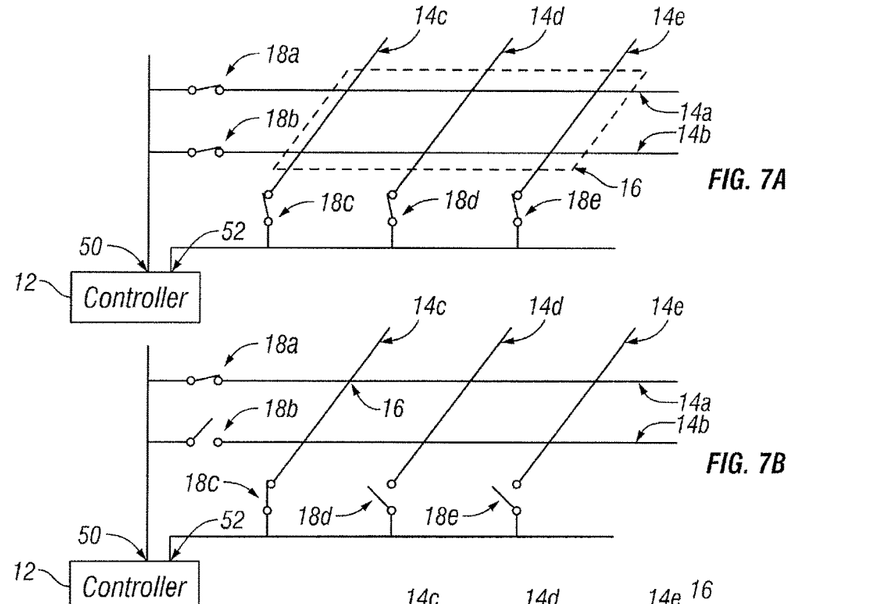
FIG. 7A illustrates an example of a configuration of the touch sensor of FIG. 2, according to certain embodiments of the present disclosure.
FIG. 7B illustrates an example of a configuration of the touch sensor of FIG. 2, according to certain embodiments of the present disclosure.

FIG. 7A depicts an example of a configuration of touch sensor 10 and touch-sensor controller 12. Connection 50 represents a drive line output that may be used to apply voltage to one or more tracks 14. Connection 52 represents a sense line input that may be used to measure the capacitance of one or more tracks 14. Switches 18a-18e are closed so that tracks 14a and 14b are driven while tracks 14c-14e are sensed. Touch-sensor controller 12 may also configure which set of tracks 14 is driven and which is sensed (e.g., tracks 14c-14e may be driven while tracks 14a and 14b are sensed). This configuration may provide a wider and/or more sensitive capacitive node 16 than configurations wherein a single track 14 is driven and a single track 14 is sensed (e.g., the configuration of FIG. 7B). Because a single capacitance measurement is taken via input 52, touch-controller sensor 12 may not be able to distinguish between capacitive effects at different buttons 6. This configuration may be used to provide improved detection of when the user approaches keyboard 4 (e.g., detecting the state shown in FIG. 5B). In some embodiments, this configuration may be used when the user is not detected near keyboard 4, and detection of the user near keyboard 4 may trigger a switch to a different configuration (e.g., the configuration shown in FIG. 7B).

FIG. 7B depicts an example of a configuration of touch sensor 10 and touch-sensor controller 12. Connection 50 represents a drive line output that may be used to apply voltage to one or more tracks 14. Connection 52 represents a sense line input that may be used to measure the capacitance of one or more tracks 14. Switch 18a is closed so that track 14a is driven, and switch 18c is closed so that track 14c is sensed. This configuration provides capacitive sensing at the intersection of tracks 14a and 14c (i.e. capacitive node 16). Touch-sensor controller 12 may also configure which set of tracks 14 is driven and which is sensed. For example, different combinations of tracks 14 may be driven and sensed in succession so that touch-sensor controller may detect capacitive changes at each intersection of tracks 14.

Figures 7C, 7D:
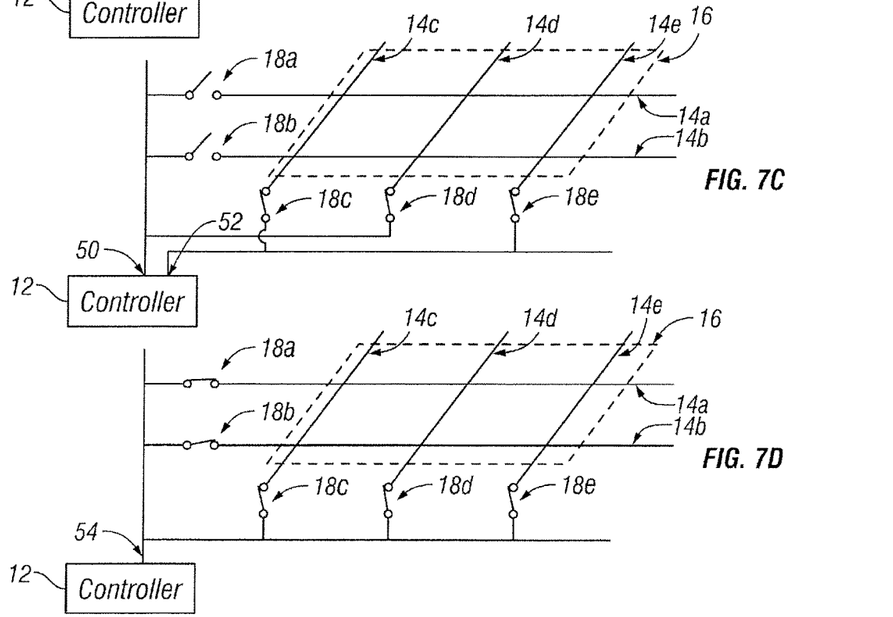
FIG. 7C illustrates an example of a configuration of the touch sensor of FIG. 2, according to certain embodiments of the present disclosure.
FIG. 7D illustrates an example of a configuration of the touch sensor of FIG. 2, according to certain embodiments of the present disclosure.

FIG. 7C depicts an example of a configuration of touch sensor 10 and touch-sensor controller 12. Connection 50 represents a drive line output that may be used to apply voltage to one or more tracks 14. Connection 52 represents a sense line input that may be used to measure the capacitance of one or more tracks 14. Switches 18c-18e are closed so that track 14d is driven while tracks 14c and 14e are sensed. Any combination of driven and sensed tracks 14 may be used, and touch-sensor controller 12 may also configure which set of tracks 14 is driven and which is sensed (e.g., tracks 14c-14e may be driven while tracks 14a and 14b are sensed). In this configuration, since multiple tracks 14 are sensed simultaneously, touch-controller sensor 12 may not be able to distinguish between capacitive effects at different buttons 6. In other words, the sensitive area extends between all sensed tracks 14. Furthermore, because the driven track or tracks 14 are parallel to the sensed lines, touch-sensor controller 12 may not be able to distinguish between capacitive changes at different points along the sensed tracks 14. This configuration may be used to provide improved detection of when the user approaches keyboard 4 (e.g., detecting the state shown in FIG. 5B). In some embodiments, this configuration may be used when the user is not detected near keyboard 4, and detection of the user near keyboard 4 may trigger a switch to a different configuration (e.g., the configuration shown in FIG. 7B).

FIG. 7D depicts an example of a configuration of touch sensor 10 and touch-sensor controller 12. Connection 54 represents a connection to touch-sensor controller 12 that may be used to provide self-capacitance measurements. Switches 18a-18e are closed so that voltage may be applied to all tracks 14 to provide a single self-capacitance measurement. This configuration may be used to provide improved detection of when the user approaches keyboard 4 (e.g., detecting the state shown in FIG. 5B). In some embodiments, this configuration may be used when the user is not detected near keyboard 4, and detection of the user near keyboard 4 may trigger a switch to a different configuration (e.g., the configuration shown in FIG. 7B).

Other configurations of touch sensor 10 may also be used. In certain embodiments, traditional electrical keyboard sensing configurations and methods may be used. For example, if tracks 14a and 14b are referred to as X-lines, and tracks 14c-14e are referred to as Y-lines, touch-sensor controller 12 may pull the X-lines low one by one while the Y-lines are pulled high with pin change interrupts on. If a conductor 20 of a particular button 6 is in contact with touch sensor 10, the resulting electrical connection at the intersection of the corresponding tracks 14 may cause that Y-line to pull low, which may cause an interrupt to occur. This interrupt may indicate that the particular button 6 has been pressed. This sensing method may be performed concurrently with capacitive sensing methods, or such methods may be triggered by the detection of a capacitive measurement that indicates that a button 6 is in the depressed state.

Figure 8:
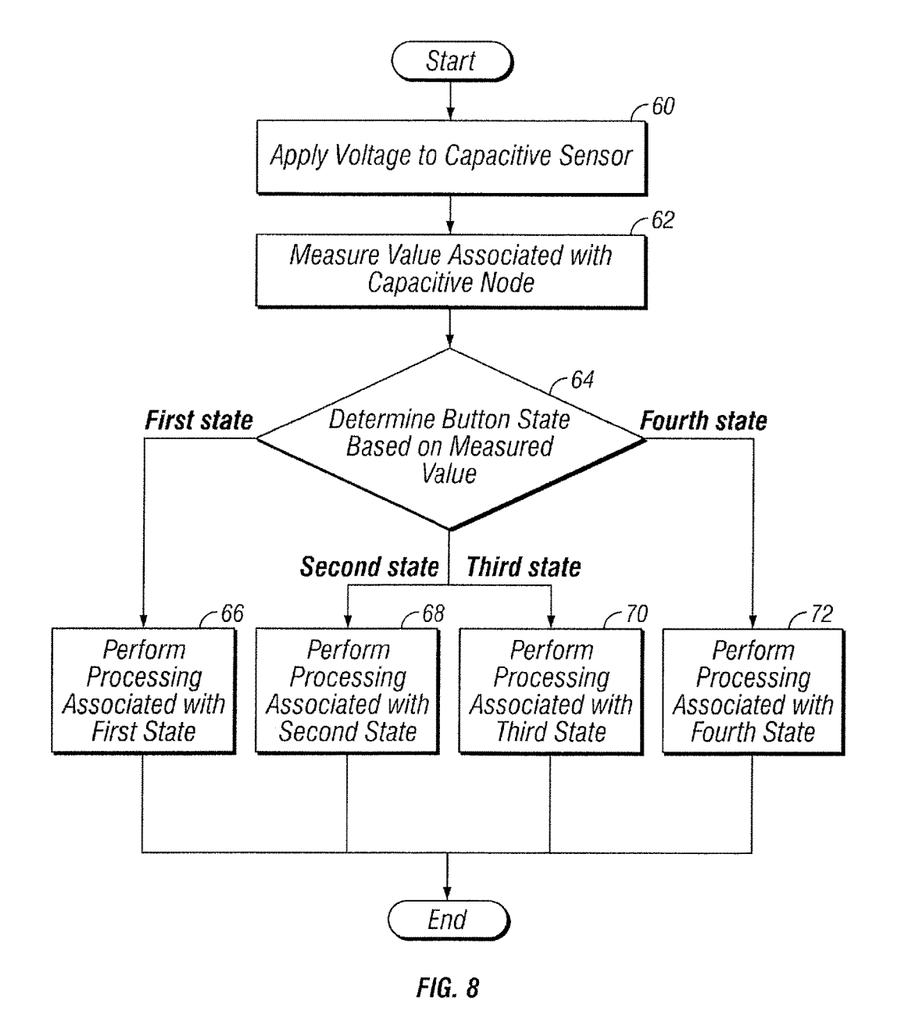
FIG. 8 illustrates an example of a keyboard sensing sequence that may be performed with a multi-state capacitive button, according to certain embodiments of the present disclosure.

FIG. 8 illustrates an example of a keyboard sensing sequence that may be performed with a multi-state capacitive button. In some embodiments, these steps are carried out using one or more components of FIGS. 1-7. Furthermore, although this disclosure describes and illustrates particular components, devices, or systems carrying out particular steps in FIG. 8, this disclosure contemplates any suitable combination of any suitable components, devices, or systems carrying out any suitable steps in FIG. 8.

At step 60, voltage is applied to a capacitive sensor. For example, voltage from a voltage supply rail may be applied to track 14*a* of touch sensor 10. Depending on the configuration of switches 18 and/or other components, voltage may be applied to a single track 14 or multiple tracks 14. Applying voltage in this manner may cause current to flow through track 14*a*, and track 14*a* may generate an electrical field that may affect nearby components, such as, for example, another track 14 or button 6*a*.

At step 62, a value associated with the capacitive sensor is measured. For example, touch-sensor controller 12 may measure a change in capacitance at a capacitive node 16. The electrical field generated during step 60 may cause capacitive coupling between two or more tracks 14. This capacitance may serve as a baseline from which capacitance changes caused by finger 26 may be measured. The capacitance may be measured by measuring the capacitance directly or by measuring any suitable value that is proportional to the capacitance at capacitive node 16 (e.g., values related to voltage, current, charge, or other suitable values associated with the capacitive sensor). Furthermore, some embodiments may measure the change in capacitance (or related values) over time. For example, certain embodiments may use integration to measure a change in capacitance at capacitive node 16 over time.

At step 64, the state of a button 6 is determined based at least on the value measured during step 62. For example, touch-sensor controller 12 may measure a capacitive change at a capacitive node 16. This value may be compared to various threshold values or value ranges to determine both the position of an object (e.g., finger 26) relative to a button 6 and the extent to which the button 6 is depressed, as explained above regarding FIGS. 5A-5D and 6. If the measured value indicates that button 6 is not depressed and that an object, such as finger 26, is not sufficiently close to button 6, the sequence proceeds to step 66. If the measured value indicates that button 6 is not depressed and that the object is sufficiently close to but not touching button 6, the sequence proceeds to step 68. If the measured value indicates that the object is touching but not depressing button 6, the sequence proceeds to step 70. If the measured value indicates that the object is touching and depressing button 6, the sequence proceeds to step 70. Particular embodiments may detect additional and/or alternate states of button 6. For example, touch-sensor controller 12 may detect one or more states associated with partial depression of a button 6, and such states may trigger responses that are different from those triggered by complete depression of button 6. As another example, the responses triggered by a particular state may be different depending on the amount of time that button 6 remains in that state. The responses triggered by a particular state may be different depending on the state of button 6 prior to the newly detected state.

At step 66, processing associated with the detected state (e.g., the state is illustrated in FIG. 5A) is performed. For example, when this state is detected, keyboard 4 and/or device 2 may enter a power-saving mode or hibernation mode, a backlight of keyboard 4 may be turned off, the user may be logged out of device 2, or any other suitable function may be performed. Any of these functions may be triggered depending on the amount of time that button 6 has been in the state detected during step 64. Furthermore, in some embodiments, this state may be inferred by the absence of other detected states (as opposed to actively detecting this state).

At step 68, processing associated with the detected state (e.g., the state is illustrated in FIG. 5B) is performed. For example, when this state is detected, a backlight of keyboard 4 may be turned on or off, the user may be logged into device 2, the user may be prompted to log into device 2, device 2 and/or keyboard 4 may exit a power-saving mode or hibernation mode, or any other suitable function may be performed. Any of these functions may be triggered depending on the amount of time that button 6 has been in the present state. Furthermore, certain functions may be triggered depending on which state was previously detected.

At step 70, processing associated with the detected state (e.g., the state is illustrated in FIG. 5C) is performed. For example, a backlight of keyboard 4 or button 6 may be turned on, the user may be logged into device 2, the user may be prompted to log into device 2, device 2 and/or keyboard 4 may exit a power-saving mode or hibernation mode, or any other suitable function may be performed. Any of these functions may be triggered depending on the amount of time that button 6 has been in the present state, and certain functions may be triggered depending on which state was previously detected. Furthermore, detecting this state may allow device 2 to distinguish between button touches and presses, which may enable additional functionality. For example, passwords may require certain buttons 6 to be touched but not pressed. Additionally, measuring multiple buttons 6 in this manner may provide touch pad functionality on the surface of keyboard 4 as the user moves finger 26 across different buttons 6.

At step 72, processing associated with the detected state (e.g., the state is illustrated in FIG. 5D) is performed. For example, device 2 and/or keyboard may register a button press that is distinguishable from a button touch (as shown in FIG. 5C). This processing may involve registering button presses while the user is typing or otherwise interacting with a button 6 in a traditional manner. Because this processing involves the detection of button presses without requiring the creation of a physical and/or galvanic connections between electrodes on touch sensor 10, mechanical wear on certain components may be reduced, which may reduce the frequency and/or cost of repairs. Furthermore, because the capacitive coupling between finger 26 and button 6 allows a button press by finger 26 and button pressed by another type of object to be distinguished, accidental touches may detected and handled appropriately. For example, the accidental pressing of a button 6 on a smartphone while in the user's pocket may be ignored. In some embodiments, detecting this state may cause touch-sensor controller 12 to switch from capacitive sensing methods to traditional electrical keyboard sensing methods, as described above. In such cases, this alternative sensing method may be used for a particular duration of time, or it may be used until button presses are no longer detected, at which point touch-sensor controller 12 may return to capacitive sensing methods (e.g., by returning to step 64).

Particular embodiments may repeat the steps of FIG. 8, where appropriate. For example, these steps may be performed on different pairs of tracks 14 in succession. Moreover, although this disclosure describes and illustrates particular steps in FIG. 8 as occurring in a particular order, this disclosure contemplates any suitable steps in FIG. 8 occurring in any suitable order. For example, one or more additional steps involving the configuration of switches 18 may be performed prior to the performance of step 60. Furthermore, the steps of FIG. 8 may be performed at different times during the operation of touch sensor 10.

Herein, "or" is inclusive and not exclusive, unless expressly indicated otherwise or indicated otherwise by context. Therefore, herein, "A or B" means "A, B, or both,"

unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the examples of embodiments herein that a person having ordinary skill in the art would comprehend. For example, while the embodiments of FIGS. 2 and 7A-7D are shown as having tracks 14a-14e and switches 18a-18e, any suitable number, type, and configuration of tracks 14 and/or switches 18 may be used. As another example, any number, type, and configuration of buttons 6 may be used, and touch-sensor controller 12 may use any suitable number and type of measurements to detect the states of buttons 6. As yet another example, touch sensor 10 may include one or more capacitive switches in place of or in addition to intersecting tracks 14 to measure the capacitance at capacitive nodes 16. Touch-sensor controller 12 may detect states other than or in addition to the button states described herein. Furthermore, in response to the various states of buttons 6 detected by touch-sensor controller 12, touch-sensor controller 12 may trigger responses in place of or in addition to the responses described herein.

Moreover, although this disclosure describes and illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. An apparatus comprising:
a sensor comprising first and second electrode tracks;
a button comprising an electrically isolating material, the button configured to capacitively couple with an object;
a conductor between the button and the sensor, the conductor configured to:
capacitively couple with a capacitive node formed by the first and second electrodes tracks of the sensor; and
form a galvanic connection between the first and second electrode tracks when the conductor comes into contact with the sensor; and
a controller connected to the sensor and configured to:
measure a value of a capacitance at the capacitive node formed by the first and second electrode tracks of the sensor, the capacitance at the capacitive node reflecting an amount of capacitive coupling between the conductor and the capacitive node formed by the first and second electrode tracks of the sensor;
detect, in response to the value meeting a first condition, a first state of the button, the first state indicating that the object is within a detectable distance of the button and that the object is not in contact with the button; and
detect, in response to the value meeting a second condition, a second state of the button, the second state indicating that the object is in contact with the button and that the conductor is not in contact with the sensor.

2. The apparatus of claim 1, wherein the amount of capacitive coupling between the conductor and the capacitive node formed by the first and second electrodes of the sensor is based at least on the following:
an amount of capacitive coupling between the electrically isolating material and the object;
an amount of capacitive coupling between the electrically isolating material and the conductor; and
a distance between the conductor and the sensor.

3. The apparatus of claim 1, wherein the controller is further configured to detect, in response to the value meeting a third condition, a third state of the button, the third state indicating that the button is partially depressed relative to the sensor and that the conductor is not in contact with the sensor.

4. The apparatus of claim 1, wherein the controller is further configured to detect, in response to the value meeting a third condition, a third state of the button, the third state indicating that the conductor has come into contact with the sensor such that the conductor forms the galvanic connection between the first and second electrodes tracks.

5. The apparatus of claim 4, wherein, in the third state the apparatus is configured to use, at least in part, mechanical switch sensing to detect the galvanic connection formed by the conductor between the first and second electrode tracks.

6. The apparatus of claim 1, wherein the touch sensor controller is configured to detect, based on the value and despite a galvanic connection formed by the conductor between the first and second electrode tracks, a third state indicating that the conductor is in contact with the sensor and that the object is not in contact with the button.

7. The apparatus of claim 1, wherein the value of the capacitance at the capacitive node formed by the first and second electrode tracks of the sensor is proportional to the capacitance at the capacitive node.

8. The apparatus of claim 1, wherein the value of the capacitance at the capacitive node formed by the first and second electrode tracks of the sensor comprises one or more of:
a capacitance measurement;
a voltage measurement;
a current measurement; and
a charge measurement.

9. The apparatus of claim 1, wherein:
the first condition is associated with a first value range;
the second condition is associated with a second value range;
the value meeting the first condition comprises the value falling within the first range; and
the value meeting the second condition comprises the value falling within the second range.

10. A method, comprising:
applying, by a controller, voltage to a sensor, the sensor proximate to a conductor that is capable of being depressed relative to the sensor, the conductor located between a button and the sensor, the sensor comprising first and second electrode tracks, the conductor configured to capacitively couple with a capacitive node formed by the first and second electrode tracks of the sensor, the button configured to capacitively couple with an object;

measuring, by the controller, a value of a capacitance at the capacitive node formed by the first and second electrode tracks of the sensor, the capacitance at the capacitive node reflecting an amount of capacitive coupling between the conductor and the capacitive node formed by the first and second electrode tracks of the sensor;

detecting, by the controller in response to the value meeting a first condition, a first state of the button, the first state indicating that the object is within a detectable distance of the button and that the object is not in contact with the button; and detecting, by the controller in response to the value meeting a second condition, a second state of the button, the second state indicating that the object is in contact with the button and that the conductor is not in contact with the sensor.

11. The method of claim 10, wherein the amount of capacitive coupling between the conductor and the capacitive node formed by the first and second electrodes of the sensor is based at least on the following:
an amount of capacitive coupling between an electrically isolating material of the button and the object;
an amount of capacitive coupling between the electrically isolating material and the conductor; and
a distance between the conductor and the sensor.

12. The method of claim 10, further comprising detecting, in response to the value meeting a third condition, a third state of the button, the third state indicating that the button is partially depressed relative to the sensor and that the conductor is not in contact with the sensor.

13. The method of claim 10, further comprising detecting, in response to the value meeting a third condition, a third state of the button, the third state indicating that the conductor has come into contact with the sensor such that the conductor forms a galvanic connection between the first and second electrodes tracks.

14. The method of claim 13, further comprising using, at least in part and in the third state, mechanical switch sensing to detect the galvanic connection formed by the conductor between the first and second electrode tracks.

15. The method of claim 10, further comprising detecting, based on the value and despite a galvanic connection formed by the conductor between the first and second electrode tracks, a third state indicating that the conductor is in contact with the sensor and that the object is not in contact with the button.

16. The method of claim 10, wherein the value of the capacitance at the capacitive node formed by the first and second electrode tracks of the sensor is proportional to the capacitance at the capacitive node.

17. The method of claim 10, wherein the value of the capacitance at the capacitive node formed by the first and second electrode tracks of the sensor comprises one or more of:

a capacitance measurement;
a voltage measurement;
a current measurement; and
a charge measurement.

18. The method of claim 10, wherein:
the first condition is associated with a first value range;
the second condition is associated with a second value range;
the value meeting the first condition comprises the value falling within the first range; and
the value meeting the second condition comprises the value falling within the second range.

19. An apparatus, comprising:
one or more processors; and
one or more storage units coupled to the one or more processors, the one or more storage units storing logic configured to, when executed by the one or more processors, cause the one or more processors to perform operations comprising:

applying, by a controller, voltage to a sensor, the sensor proximate to a conductor that is capable of being depressed relative to the sensor, the conductor located between a button and the sensor, the sensor comprising first and second electrode tracks, the conductor configured to capacitively couple with a capacitive node formed by the first and second electrode tracks of the sensor, the button configured to capacitively couple with an object;

measuring, by the controller, a value of a capacitance at the capacitive node formed by the first and second electrode tracks of the sensor, the capacitance at the capacitive node reflecting an amount of capacitive coupling between the conductor and the capacitive node formed by the first and second electrode tracks of the sensor;

detecting, by the controller in response to the value meeting a first condition, a first state of the button, the first state indicating that the object is within a detectable distance of the button and that the object is not in contact with the button; and detecting, by the controller in response to the value meeting a second condition, a second state of the button, the second state indicating that the object is in contact with the button and that the conductor is not in contact with the sensor.

20. The apparatus of claim 19, wherein the operations further comprise detecting, in response to the value meeting a third condition, a third state of the button, the third state indicating that the button is partially depressed relative to the sensor and that the conductor is not in contact with the sensor.

* * * * *